United States Patent [19]

Reichelderfer, deceased et al.

[11] Patent Number: 5,016,332

[45] Date of Patent: May 21, 1991

[54] PLASMA REACTOR AND PROCESS WITH WAFER TEMPERATURE CONTROL

[75] Inventors: Richard F. Reichelderfer, deceased, late of Pleasanton, by Desirée Reichelderfer, legal representative; Janice I. McOmber, Redwood City; Andrew P. Ryan, Napa; John T. Davies, El Sobrante, all of Calif.

[73] Assignee: Branson International Plasma Corporation, Hayward, Calif.

[21] Appl. No.: 509,379

[22] Filed: Apr. 13, 1990

[51] Int. Cl.[5] .................... H01L 21/30; H01L 21/324
[52] U.S. Cl. .................................................. 29/25.01
[58] Field of Search ............. 29/25.01; 118/620, 50.1, 118/728, 729; 432/241, 205, 144, 152, 137

[56] References Cited

U.S. PATENT DOCUMENTS 4,788,416  11/1988  Price ........................ 118/50
4,888,088  12/1989  Slomowitz ................. 118/50.1

Primary Examiner—Olik Chaudhuri
Assistant Examiner—Long Pham
Attorney, Agent, or Firm—Flehr, Hohbach, Test, Albritton and Herbert

[57] ABSTRACT

Gas plasma system and process which are particularly suitable for photoresist stripping and descumming operations. A wafer is placed on a heated platen in a processing chamber and is lifted away from the platen to control thermal contact between the wafer and the platen. The front side of the wafer is also heated with radiant heat energy, and the temperature of the platen is adjusted to control the temperature of the wafer. In the disclosed embodiments, a gas plasma is generated outside the processing chamber and introduced into the chamber through a gas distribution plate which is also transparent to the radiant heat energy.

12 Claims, 3 Drawing Sheets

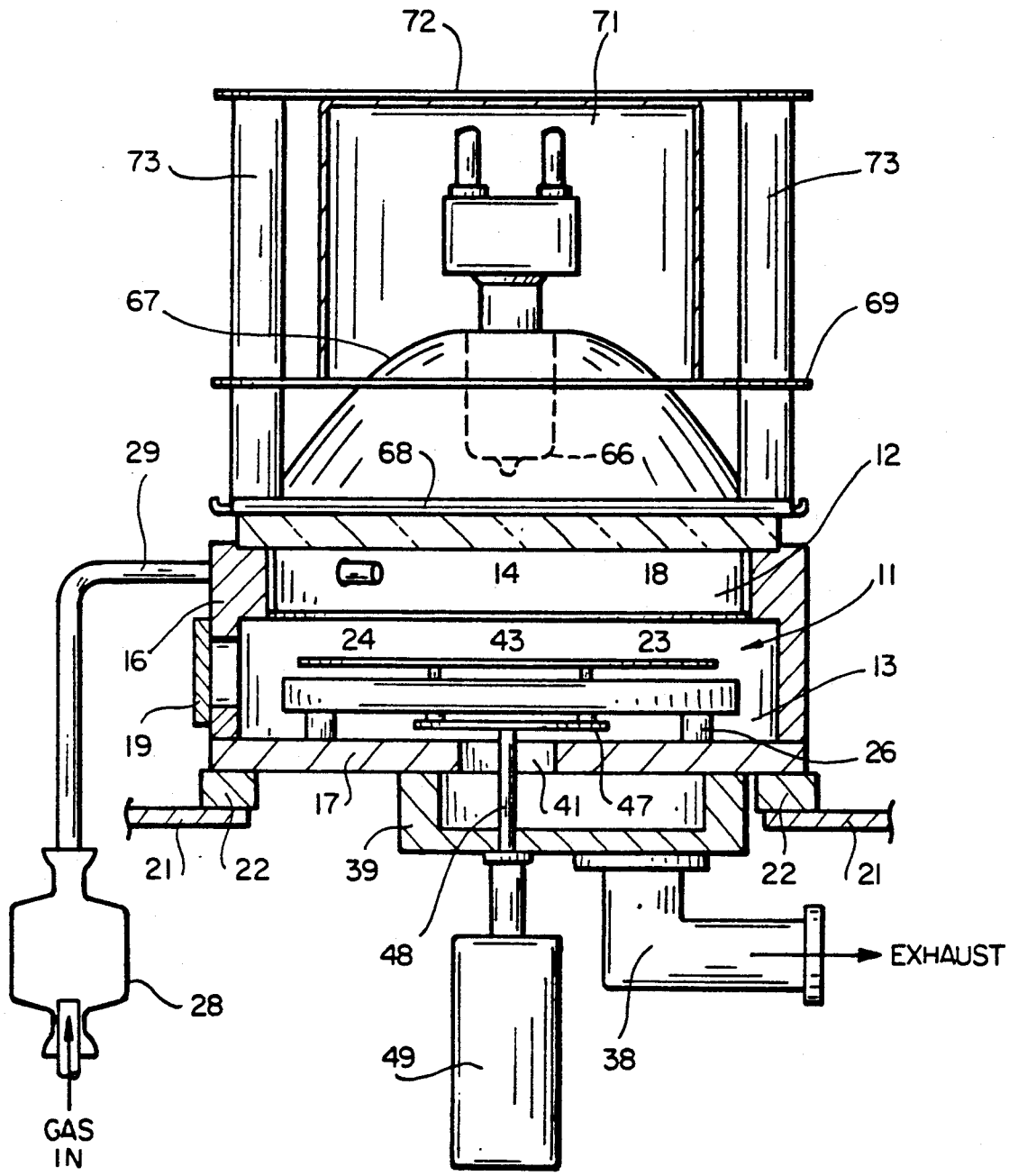
FIG_1

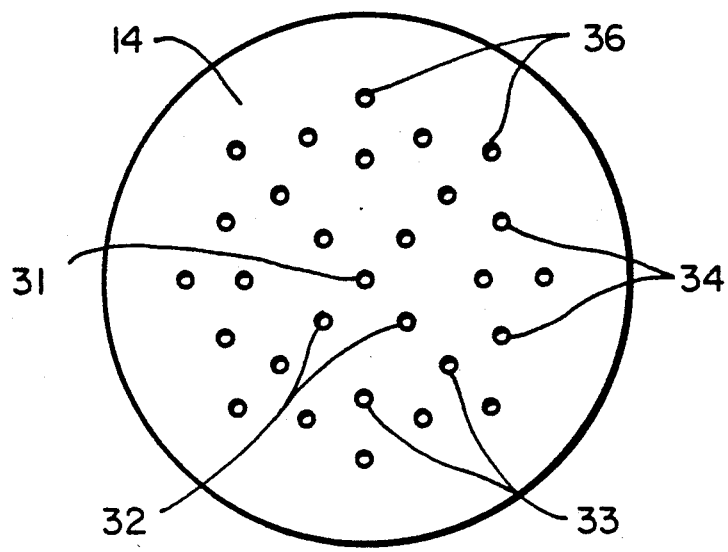
FIG_2
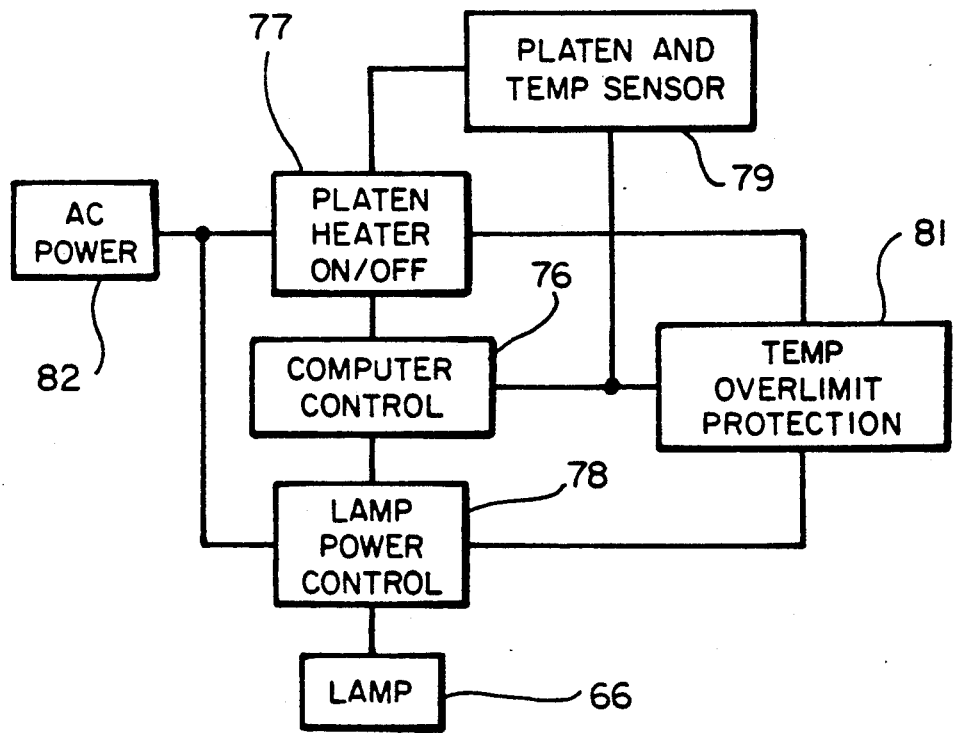
FIG_4

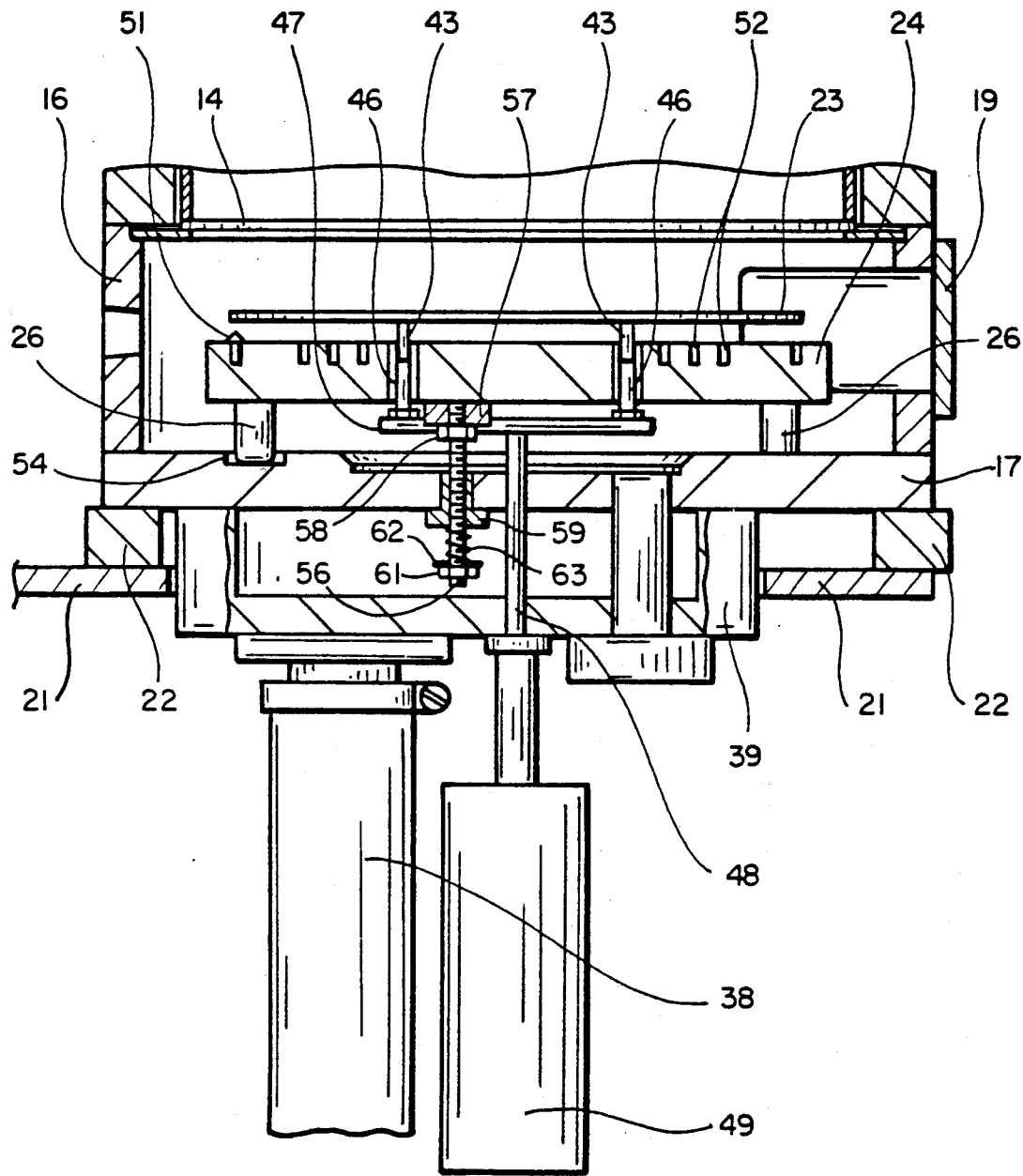
FIG_3

PLASMA REACTOR AND PROCESS WITH WAFER TEMPERATURE CONTROL

This invention pertains generally to the processing of semiconductor wafers and, more particularly, to a gas plasma system and process which are particularly suitable for photoresist stripping and descumming operations.

It is in general an object of the invention to provide a new and improved gas plasma system and process for the treatment of semiconductor wafers.

Another object of the invention is to provide a system and process of the above character which are particularly suitable for use in photoresist stripping and descumming operations.

These and other objects are achieved in accordance with the invention by placing a wafer on a heated platen in a processing chamber, lifting the wafer away from the platen to control thermal contact between the wafer and the platen, heating the front side of the wafer with radiant heat energy, and adjusting the temperature of the platen to control the temperature of the wafer. In the disclosed embodiments, a gas plasma is generated outside the processing chamber and introduced into the chamber through a gas distribution plate which is also transparent to the radiant heat energy.

BRIEF DESCRIPTION OF THE FIGURES

FIG. 1 is a vertical sectional view, somewhat schematic, of one embodiment of a plasma reactor incorporating the invention.

FIG. 2 is a top plan view of a gas distribution plate in the embodiment of FIG. 1.

FIG. 3 is an enlarged fragmentary sectional view illustrating the platen in the embodiment of FIG. 1.

FIG. 4 is a simplified block diagram of a temperature control system utilized in the embodiment of FIG. 1.

DETAILED DESCRIPTION OF THE INVENTION

As illustrated in the drawings, the reactor includes a processing chamber 11 which has an upper section 12 and a lower section 13 separated by an aperture plate 14. The chamber is formed by a side wall 16, a base plate 17 and a top plate 18. Access to the lower section of the chamber is provided by a door 19 in side wall 16. In one presently preferred embodiment, side wall 16 and base plate 17 are fabricated of an electrically conductive material such as aluminum, and aperture plate 14 and top plate 18 are fabricated of quartz. Base plate 17 is mounted on a mounting plate 21 and separated therefrom by spacers 22.

A heated platen 23 is located in the lower section of the processing chamber for receiving a wafer 24. The platen is mounted on base plate 18 and isolated therefrom by electrically insulative spacers 26. The platen is a hollow structure fabricated of an electrically and thermally conductive material such as aluminum, and includes an electrically energized heating element of a suitable known type.

Plasma for processing wafers in the processing chamber is generated outside the processing chamber in a separate plasma generating chamber 28. The plasma is delivered to the upper section of the processing chamber by a quartz tube 29 connected between the two chambers. The plasma can be generated by any suitable means such as by RF energization or by microwaves, and in one presently preferred embodiment, it is generated by RF energy at a frequency of 13.56 MHz.

The excited species of the plasma pass the upper section of the processing chamber to the lower section through the apertures in plate 14, which is shown in greater detail in FIG. 2. This plate has central aperture 31, with a ring of four apertures 32 and three rings of eight apertures 33, 34 and 36 spaced arranged concentrically about the central aperture. The apertures serve to distribute the gas plasma evenly within the lower section of the chamber, and they can be of any suitable size and number, and they can be arranged in any suitable pattern. In the embodiment illustrated, the plate has a diameter of 8 inches, each of the apertures has a diameter on the order of 0.5 cm, and rings 32-36 have diameters of 2, 4, 5 and 6 inches, respectively, with the apertures in ring 34 being offset by an angle of 22.5 degrees from the apertures in rings 33 and 36.

Gases are removed from the processing chamber through an exhaust line 38 which is connected to a housing 39 mounted on the under side of base plate 17, with communication between the lower section of the chamber and housing 39 being provided by a central opening 41 in the base plate.

Means is provided for lifting the wafer away from the platen to control the amount of heat transfer between the platen and the wafer and, thus, the temperature of the wafer. This means includes a plurality of lift pins 43 which pass through sleeved openings 44 in the platen and engage the back side of the wafer. The pins are mounted in holders 46 which are attached to a carrier 47 positioned beneath the platen. The carrier is mounted on the axially extensible output shaft or rod 48 of a pneumatic cylinder 49 and, thus, adapted to be raised and lowered relative to the platen. In one presently preferred embodiment, three lifting pins are provided, and they are spaced equally about the axis of the platen, but any suitable number of pins can be employed.

When the lifting pins are in their most retracted position, the wafer is positioned by the conical heads of locator pins 51. These pins are removably mounted in sockets 52 arranged in circular patterns of different diameters in the upper surface of the platen, and they can be arranged in the sockets in accordance with the size of the wafer being processed.

As noted above, the platen is isolated electrically from the metal walls of the processing chamber, resting upon electrically insulative spacers 26 which are received in recessed areas 54 in the upper surface of bottom plate 17. The platen is retained in position by a stud 56 which is threadedly attached to a block 57 on the under side of the platen and is locked against rotation by a nut 58 tightened against the lower face of the block. The stud passes freely through an insulated bushing 59 in the bottom plate, and a nut 61 and washer 62 are mounted on the lower end of the stud. A coil spring 63 mounted on the stud between bushing 59 and washer 62 draws the platen in a downward direction.

Means is also included for providing a controlled amount of heating on the front side of the wafer, and this has been found to be particularly effective in photoresist stripping and descumming operations. This means includes a radiant heat lamp 66 which is positioned above the platen at the focus of a parabolic reflector 67. The lamp can be of any suitable type, such as a halogen lamp, which produces radiation of relatively short wavelength which passes through quartz plates 18 and 14 without appreciable absorption and impinges upon the upper (front) side of the wafer. The reflector directs the radiation from the lamp along parallel paths toward the wafer. If desired, the aperture plate 14 can be frosted or otherwise treated to diffuse the radiation and provide more even heating of the wafer.

The reflector is mounted between a base plate 68, which is positioned directly above quartz plate 18, and a retainer plate 69 which is spaced above and generally parallel to the base plate. A lamp shroud 71 is mounted on a top plate 72 which is spaced above the retainer plate. The three plates are held together by a plurality of vertically extending posts 73 which are spaced peripherally about the lamp assembly.

Referring now to FIG. 4, the system for controlling the heating of the platen and the wafer is shown in simplified form. This system includes a computer control 76 of suitable known design such as an IBM AT or a so-called "compatible", a platen power control circuit 77, a lamp power control circuit 78, a platen and temperature sensor 79, and a temperature overlimit protection circuit 81. Operating power is obtained from an AC power source 82. Control circuits 77, 78 turn the platen heater on and off and vary the power supplied to the heat lamp under the control of the computer, and circuit 81 turns the platen heater and the lamp off in the event that the temperature in the processing chamber exceeds a predetermined limit.

Operation and use of the reactor, and therein the method of the invention, are as follows. A wafer to be processed is placed on the platen and held in position by locator pins 51 with the front side facing up. The platen heater is energized to heat the wafer from the back side, and lamp 66 is energized to heat the front side of the wafer. The amount of heating on the back side is controlled by turning the platen heater on and off. Thermal contact between the wafer and the platen can be controlled by actuating cylinder 49 to move the wafer toward or away from the platen. The heating of the front side of the wafer is controlled by adjusting the amount of power supplied to the lamp. By adjusting the heating of both the front and the back sides of the wafer in this manner, it is possible to control the temperature of the wafer quite accurately and to provide localized heating on the front side of the wafer.

It is apparent from the foregoing that a new and improved system and process for treating semiconductor wafers have been provided. While only certain presently preferred embodiments have been described in detail, as will be apparent to those familiar with the art, certain changes and modifications can be made without departing from the scope of the invention as defined by the following claims.

What is claimed is:

1. In a system for treating a workpiece with a gas plasma: a processing chamber, a platen for supporting the workpiece in the chamber with the front side of the workpiece facing away from the platen, means for providing a gaseous plasma in the chamber, means for heating the platen, means including a plurality of lift pins engageable with the back side of the workpiece for lifting the workpiece away from the platen, and means for heating the front side of the workpiece with a controlled amount of radiant heat energy.

2. The system of claim 1 wherein the means for providing the plasma includes means for generating the plasma outside the processing chamber and a gas distribution plate having a plurality of spaced apart apertures through which excited species in the plasma are introduced into the chamber.

3. The system of claim 1 wherein the means for lifting the wafer includes a pneumatically operated actuator.

4. The system of claim 1 wherein the means for heating the front side of the wafer includes a radiant heat lamp and a reflector for directing heat energy from the lamp toward the front side of the wafer.

5. In a system for treating a workpiece with a gas plasma: a processing chamber, a heated platen for supporting the workpiece in the chamber, means for providing a gaseous plasma for treating the workpiece, a plurality of lift pins passing through the platen for engagement with the workpiece, and means for raising and lowering the pins to adjust the position of the workpiece relative to the platen.

6. The system of claim 5 wherein the means for raising and lowering the pins includes a carrier for the pins and a pneumatically operated cylinder for raising and lowering the carrier.

7. The system of claim 5 wherein the means for providing the plasma includes means for generating the plasma outside the processing chamber and a gas distribution plate having a plurality of spaced apart apertures through which excited species of the plasma are introduced into the chamber.

8. In a system for treating a workpiece with a gas plasma: a processing chamber, means for supporting the workpiece in the chamber, means for providing a gaseous plasma in the chamber, a radiant heat lamp, means for directing heat energy from the lamp to one side of the workpiece, and means for adjusting the amount of power applied to the lamp to control the amount of radiant heat energy produced by the lamp and hence the temperature of the one side of the workpiece.

9. The system of claim 8 wherein the reflector is a parabolic reflector, and the radiant heat lamp is positioned at the focus of the reflector.

10. The system of claim 8 wherein the means for providing the plasma includes means for generating the plasma outside the processing chamber and a gas distribution plate having a plurality of spaced apart apertures through which excited species of the plasma are introduced into the chamber.

11. In a system for treating a workpiece with a gas plasma: a processing chamber, a heated platen for supporting the workpiece in the chamber, means for generating a gaseous plasma outside the processing chamber, a diffusion plate spaced from and generally parallel to the workpiece and having a plurality of spaced apart apertures through which the plasma can diffuse, means for introducing the plasma into the chamber through the gas distribution plate, means for lifting the workpiece away from the platen to control thermal contact between the platen and the workpiece, and means for supplying a controlled amount of radiant heat energy to a portion of the workpiece to provide loclized heating of the workpiece.

12. The system of claim 11 wherein the gas distribution plate is positioned between the wafer and the means for supplying the radiant heat energy to the wafer, and is substantially transparent to the radiant heat energy.

* * * * *